(12) United States Patent
Hosono

(10) Patent No.: US 7,420,843 B2
(45) Date of Patent: Sep. 2, 2008

(54) NON-VOLATILE SEMICONDUCTOR MEMORY DEVICE

(75) Inventor: Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 77 days.

(21) Appl. No.: 11/512,325

(22) Filed: Aug. 30, 2006

(65) Prior Publication Data

US 2007/0047313 A1 Mar. 1, 2007

(30) Foreign Application Priority Data

Aug. 31, 2005 (JP) .............................. 2005-251988

(51) Int. Cl.
*G11C 16/04* (2006.01)
(52) U.S. Cl. ............................... 365/185.17; 365/185.18
(58) Field of Classification Search ............ 365/185.17, 365/185.18, 185.25
See application file for complete search history.

(56) References Cited

U.S. PATENT DOCUMENTS

| | | | |
|---|---|---|---|
| 6,011,287 A * | 1/2000 | Itoh et al. .................... | 257/315 |
| 6,064,611 A | 5/2000 | Tanaka et al. | |
| 6,208,573 B1 | 3/2001 | Tanaka et al. | |
| 6,344,996 B2 | 2/2002 | Tanaka et al. | |
| 6,525,964 B2 | 2/2003 | Tanaka et al. | |
| 6,621,738 B2 | 9/2003 | Tanaka et al. | |
| 6,859,394 B2 | 2/2005 | Matsunaga et al. | |
| 6,868,013 B2 | 3/2005 | Tanaka et al. | |

FOREIGN PATENT DOCUMENTS

| | | |
|---|---|---|
| JP | 10-283788 | 10/1998 |
| JP | 11-219595 | 8/1999 |

* cited by examiner

*Primary Examiner*—Vu A Le
(74) *Attorney, Agent, or Firm*—Oblon, Spivak, McClelland, Maier & Neustadt, P.C.

(57) ABSTRACT

A non-volatile semiconductor memory device including a NAND cell unit with a plurality of electrically rewritable and non-volatile memory cells connected in series, a source line coupled to one end of the NAND cell unit, and a bit line coupled to the other end of the NAND cell unit, wherein the NAND cell unit is biased in a data write mode as follows: a write voltage Vpgm is applied to a control gate of a selected memory cell in the NAND cell unit; a channel-isolating voltage is applied to control gates of non-selected memory cells disposed on the source line side of the selected memory cell at intervals of a certain number of memory cells; and a write medium voltage Vm lower than Vpgm is applied to control gates of the remaining non-selected memory cells.

17 Claims, 14 Drawing Sheets

"0" Write

"0" Write

NON-VOLATILE SEMICONDUCTOR MEMORY DEVICE

CROSS-REFERENCE TO RELATED APPLICATION

This application is based on and claims the benefit of priority from the prior Japanese Patent Application No. 2005-251988, filed on Aug. 31, 2005, the entire contents of which are incorporated herein by reference.

BACKGROUND OF THE INVENTION

1. Field of the Invention

This invention relates to an electrically rewritable and non-volatile semiconductor memory device (EEPROM), especially relates to a NAND-type flash memory.

2. Description of the Related Art

A NAND-type flash memory is known as one of EEPROMs. In the NAND-type flash memory, multiple memory cells are connected in series in such a way that adjacent two memory cells share a source/drain diffusion area, thereby constituting a NAND cell unit. Therefore, the unit cell area is made smaller than that of a NOR-type flash memory, and it is easy to achieve a large capacity. Further, since data write is performed with F-N tunneling current, the power consumption is small. As a result, it is possible to make the number of cells written at a time large, so that it is able to do substantially a high-speed write.

In the NAND-type flash memory, it is used such a self boost scheme that the "1" write NAND cell channel is effectively boosted for preventing "1" write cells (write-inhibiting cells) and other non-selected cells from being injected with electrons (for example, refer to Unexamined Japanese patent Application Publication No. 10-283788).

In the self boost scheme shown in the above-described publication, write voltage Vpgm is applied to a selected memory cell; 0[volts] to a source side neighbor non-selected memory cell; and write medium voltage Vm (<Vpgm) to the other non-selected memory cells. With this voltage application, at "1" data writing time, the selected cell's channel and the bit line side non-selected cells' channel are separated from the source line side cells' channel, and these channels are efficiently boosted.

However, in case the non-selected cell is set at 0[volts], which is disposed just adjacent to the selected cell with the write voltage Vpgm applied, a leakage current is generated due to band-to-band tunneling at the drain edge of the non-selected cell with the channel separating or isolating voltage, 0V, applied, and it is possible to cause erroneous write. In consideration of this point, it has already been provided such an improved self boost scheme that a few non-selected cells, to which a voltage slightly higher than 0V is applied, are disposed between the selected cell with the write voltage Vpgm applied and the non-selected cell with the channel-isolating voltage applied.

For example, explaining in detail, the second non-selected cell from the selected cell is set at 0[volts]; and the first non-selected cell neighboring the selected cell at Va (>0) [volts]. As a result, the channel region from the selected cell with Vpgm applied to the non-selected cell with 0V applied has such a potential distribution that is gradually decreased, resulting in that the selected cell's channel potential boosted by Vpgm is not directly applied to the drain edge of the non-selected cell with 0V applied, so that the erroneous write due to the band-to-band tunneling is suppressed.

However, in the self boost scheme provided in the prior art, there is remained a danger of write disturbance (erroneous write) in the non-selected cells.

SUMMARY OF THE INVENTION

According to an aspect of the present invention, there is provided a non-volatile semiconductor memory device including: a NAND cell unit with a plurality of electrically rewritable and non-volatile memory cells connected in series; a source line coupled to one end of the NAND cell unit; and a bit line coupled to the other end of the NAND cell unit, wherein the NAND cell unit is biased in a data write mode as follows:

a write voltage Vpgm is applied to a control gate of a selected memory cell in the NAND cell unit;

a channel-isolating voltage is applied to control gates of non-selected memory cells disposed on the source line side of the selected memory cell at intervals of a certain number of memory cells; and a write medium voltage Vm lower than Vpgm is applied to control gates of the remaining non-selected memory cells.

According to another aspect of the present invention, there is provided a non-volatile semiconductor memory device including: a NAND cell unit with a plurality of electrically rewritable and non-volatile memory cells connected in series; a source line coupled to one end of the NAND cell unit; and a bit line coupled to the other end of the NAND cell unit, wherein the NAND cell unit is biased in a data write mode as follows:

a write voltage Vpgm is applied to a control gate of a selected memory cell in the NAND cell unit;

a first channel-isolating voltage Vc is applied to a control gate of a non-selected memory cell located near the selected memory cell on the source line side for isolating a first channel region of unwritten memory cells on the bit line side from a second channel region of previously written memory cells on the source line side;

a second channel-isolating voltage Vb ($\geqq$Vc) is applied to control gates of non-selected memory cells disposed at intervals of a certain number of memory cells on the source line side of the non-selected memory cell with the first channel-isolating voltage Vc applied for dividing the second channel region into multiple channel sections; and a write medium voltage Vm (Vb<Vm<Vpgm) is applied to control gates of the remaining non-selected memory cells.

According to still another aspect of the present invention, there is provided a method of writing a non-volatile semiconductor memory device with a plurality of electrically rewritable and non-volatile semiconductor memory cells connected in series to constitute a NAND cell unit, both ends of the NAND cell unit being coupled to a bit line and a source line, respectively, including:

controlling the channel potential of a selected memory cell in the NAND cell unit in accordance with write data supplied via the bit line; and applying a write voltage Vpgm and a write medium voltage Vm (<Vpgm) to a control gate of the selected memory cell and control gates of non-selected memory cells, respectively, wherein a channel-isolation voltage is applied to control gates of non-selected memory cells disposed at intervals of a certain number of memory cells on the source line side of the selected memory cell simultaneously with the write voltage.

DETAILED DESCRIPTION OF THE EMBODIMENTS

Illustrative embodiments of this invention will be explained with reference to the accompanying drawings below.

Prior to the explanation of the embodiment, the subject to be solved in the present invention will be explained in detail. The subject to be solved is in that in case a selected cell is near the bit line contact in a NAND cell unit (i.e., in case there are many non-selected and written cells disposed on the source side of the selected cell), there is a fear of generating erroneous write at the non-selected cell disposed at the edge in the written cells' area. It has been confirmed that in case the design rule is made small such as from 90 nm to 70 nm, the above-described erroneous write is easily generated.

Figure 1:
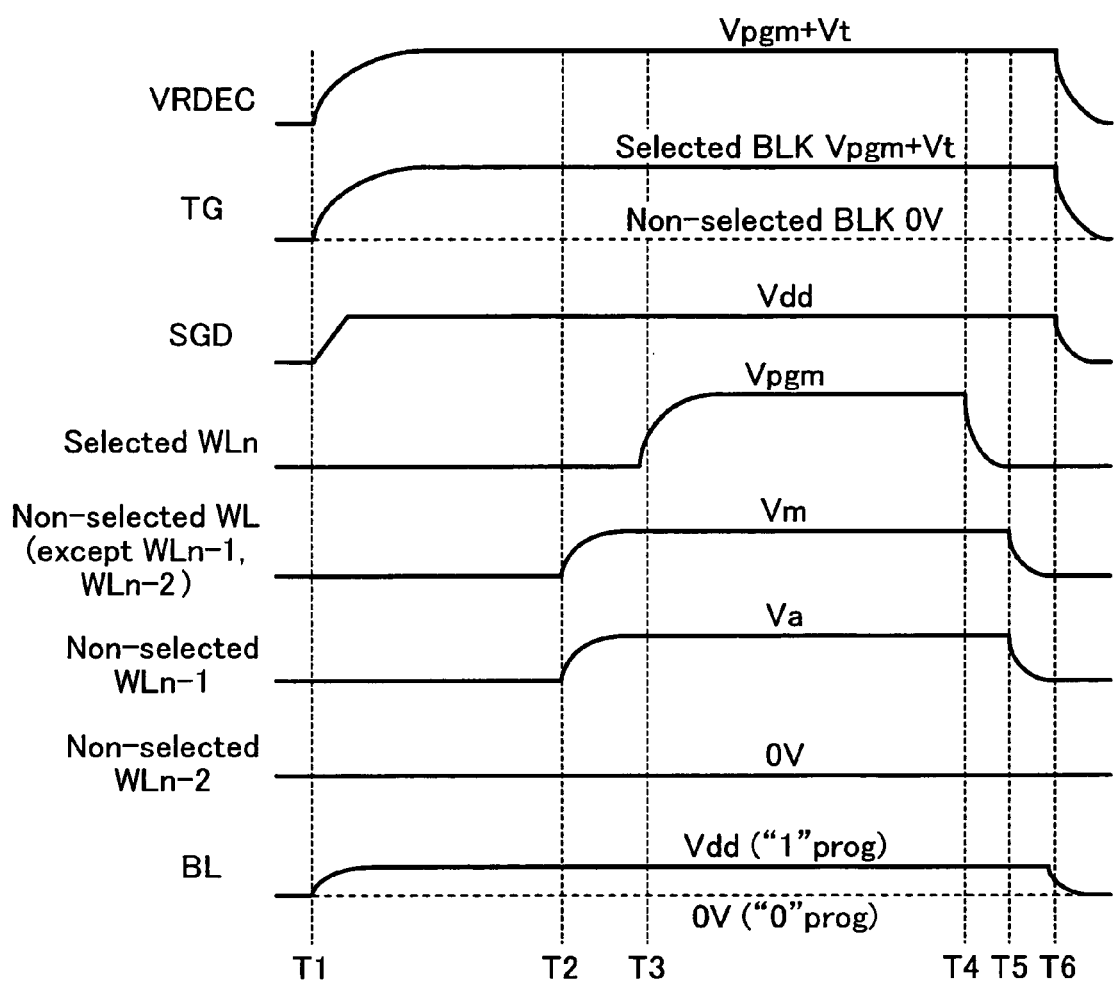
FIG. 1 shows voltage waveforms in a self boost write method having a function of separating boosted channels.

FIG. 1 shows an example of operation voltage waveforms in the NAND flash memory at a write time. Supposing that the selected word line is WLn, to which the write voltage Vpgm (about 20[volts]) is applied at a certain timing. Other non-selected word lines in the NAND string (i.e., NAND cell unit) will be applied with voltages on the basis of the selected word line WLn as follows:

the source line side neighboring non-selected word line (i.e., the first non-selected word line) WLn-1 is applied with Va (about 3[volts]); the source line side next neighboring non-selected word line (i.e., the second non-selected word line) WLn-2 with channel isolating voltage of 0[volts]; and the remaining non-selected word lines with write medium voltage Vm (about 8[volts]). The write medium voltage Vm is set to be able to boost the channel of previously written and non-selected cells to a certain level.

In this case, the channel-isolating voltage is not applied to the non-selected word line disposed just adjacent to the selected word line with Vpgm applied, but a non-selected cell (non-selected word line) with Va [volts] (0<Va<Vpgm) applied is disposed between the selected cell and the non-selected cell with 0[volts] applied. The reason of this is for decreasing the electric field of the cell channel under these word lines.

Figure 2:
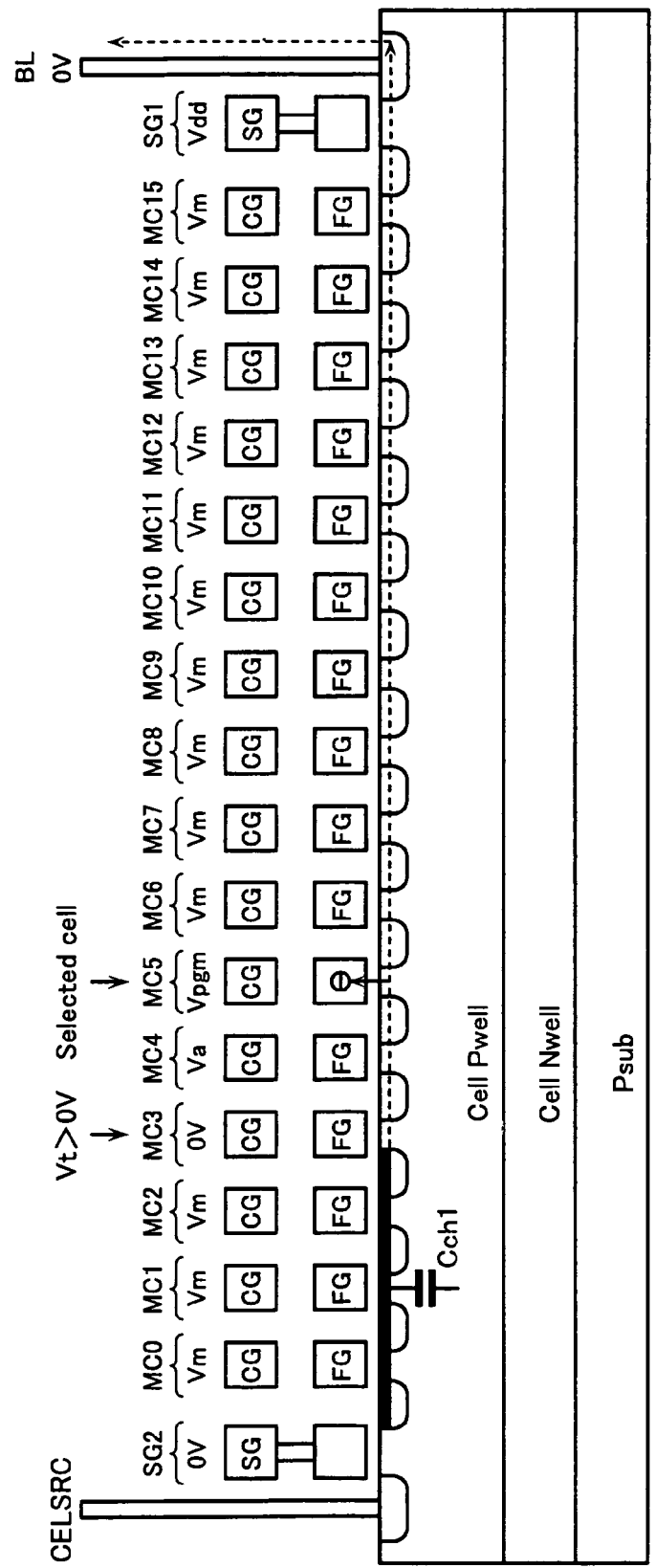
FIG. 2 shows a voltage application state in the NAND cell unit in such a case that MC5 is selected as a "0" write cell.

FIG. 2 shows the sectional view of a NAND cell unit under the above-described situation with the write pulses applied. In this case, the NAND cell unit has sixteen memory cells MC0-MC15 connected in series. Each memory cell has a floating gate FG and a control gate CG, which are stacked above the cell channel region. This memory cell has a threshold voltage defined by the quantity of charge in the floating gate FG and stores the threshold voltage state as a data in a non-volatile manner.

Erase operation is performed with applying an erase voltage Vera[volts] to the p-type well, on which the memory cell array is formed; and 0[volts] to the entire word lines in a selected block, thereby discharging the charge stored in the floating gate FG. As a result, the memory cells in the selected block become an erase state with a low and negative threshold voltage.

Write operation includes a case of shifting the threshold voltage and another case of not shifting the threshold voltage in accordance with write data. In a "0" write cell, the threshold of which is to be shifted, write voltage Vpgm of about 20[volts] is applied to the selected word line under the condition that 0[volts] is applied to the cell channel via the lo bit line. As a result, electrons are injected into the floating gate of the memory cell due to FN tunneling, and the threshold voltage is made high.

By contrast, in a "1" write cell, the threshold voltage of which is not to be shifted, the write voltage Vpgm is applied to the selected word line under the condition that the cell channel is set to be in a floating state of Vdd-Vt; and the write medium voltage Vm of about 8[volts] is applied to non-selected word line except the source line side neighboring two non-selected word lines. In this selected cell, the cell channel is boosted by capacitive coupling from the control gate, and electron injection into the floating gate, i.e., threshold voltage shifting ("0" write) will not occur.

FIG. 2 shows a "0" write state when the memory cell MC5 is selected. In case the threshold voltage of the memory cell MC3 is over 0[volts], when word lines of the memory cells MC0-MC2 rise to Vm, the cell channels and diffusion areas of these memory cells MC0-MC3 will be boosted by capacitive coupling from the word lines. For example, suppose that when Vm is 8[volts], the channel region will be boosted to about 4[volts].

In this case, on the bit line side of the memory cell MC3, the source/drain regions of the memory cells is biased at 0[volts] in accordance with "0" write data (Vss=0[volts]) applied via the bit line, the channel charge of the memory cells MC0-MC2 may be discharged to the bit line side via the memory cell MC3. The charge stored in the capacitance Cch1 of the channel regions of memory cells MC0-MC3 becomes the discharging current source.

Figure 3:
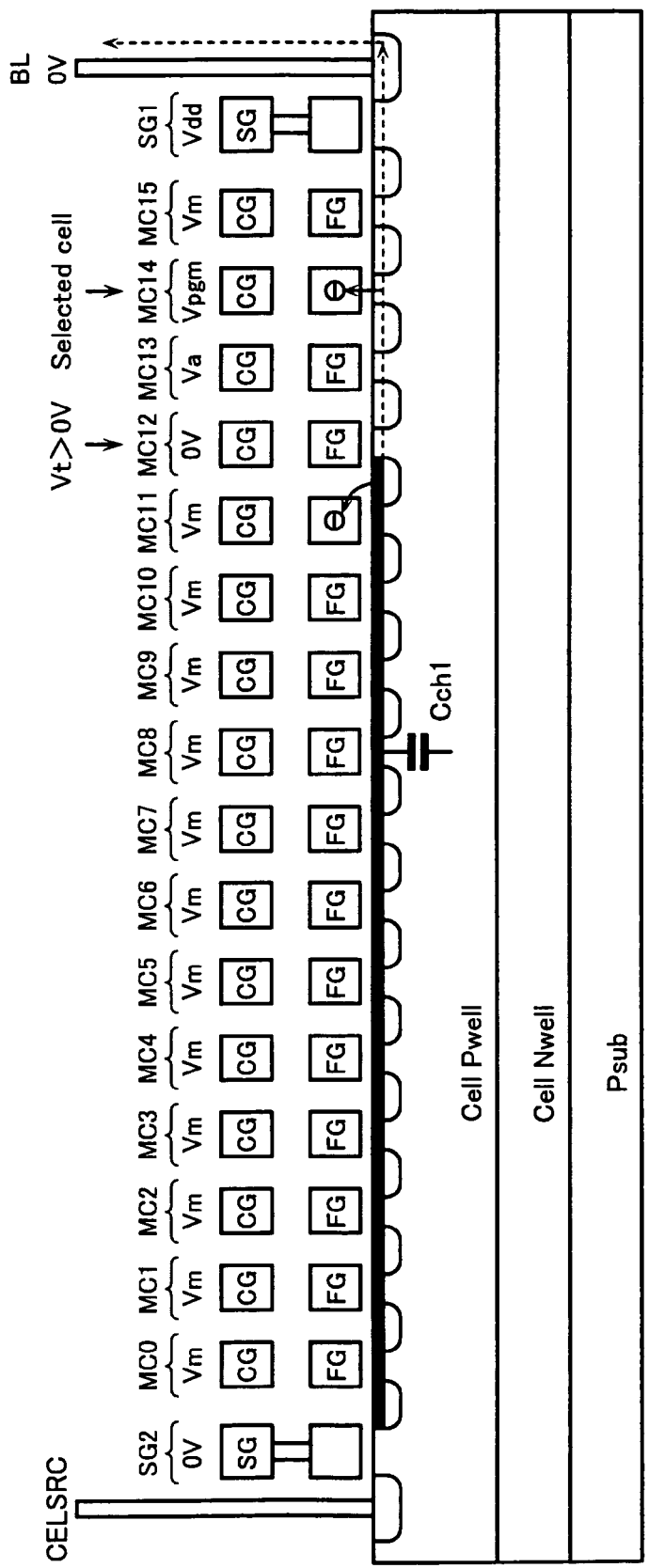
FIG. 3 shows a voltage application state in the NAND cell unit in such a case that MC14 is selected as a "0" write cell.

FIG. 3 shows a "0" write state when the memory cell MC14 is selected, which is disposed nearer the bit line contact in comparison with that shown in FIG. 2. In this case, write voltage Vpgm is applied to the selected word line corresponding the selected memory cell MC14; Va[volts] to the source line side neighboring non-selected word line corresponding to the memory cell MC13; and 0[volts] to the source line side neighboring non-selected word line corresponding to memory cell MC12.

Suppose here that the threshold voltage of the memory cell MC12 is over 0[volts] (i.e., write state). In this case, as similar to that shown in FIG. 2, when the word lines of memory cells MC0-MC11 rise to Vm, cell channels (including diffusion areas) are set in a state that may be boosted to about 0.5×Vm [volts] due to capacitive coupling.

In this case, there is a large possibility of generating erroneous write that is never viewed in the case shown in FIG. 2. That is, although the write target is the memory cell MC14, a large write disturbance occurs in the memory cell MC11 disposed on the source line (CELSRC) side adjacent to the memory cell MC12 with 0[volts].

The reason will be explained as follows. In the example shown in FIG. 3, there are more non-selected memory cells disposed on the source line (CELSRC) side of the memory cell with 0[volts] applied than the example shown in FIG. 2. In other words, capacitance Cch1 of the channel and diffusion area to be boosted by non-selected word lines on the source line side of the selected word line (it will be referred to as "channel capacitance" hereinafter) is larger than that in the example shown in FIG. 2.

Figure 5:
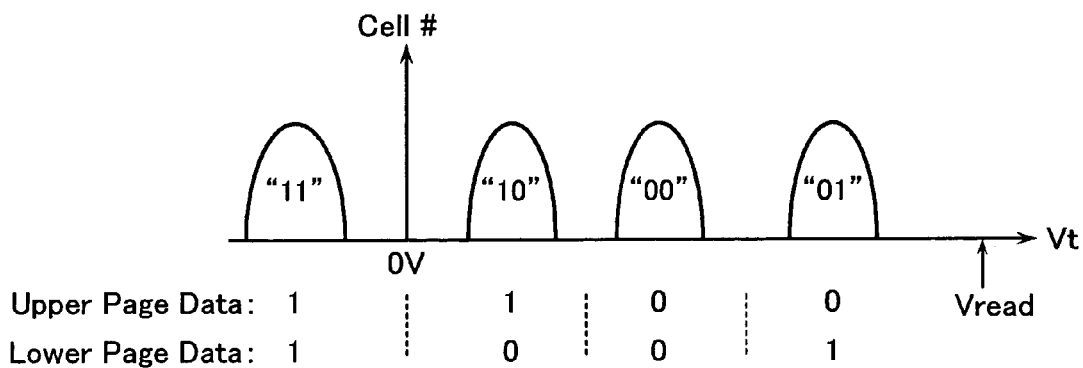
FIG. 5 shows an example of a four-level data bit assignment of the NAND-type flash memory.

For example, suppose here that the memory cell MC12 is in a relatively low threshold state such as data "10" in the four-value data or four-level data shown in FIG. 5. The source node (i.e., source line CELSRC side) of the memory cell MC12 is at a boosted high potential while the drain node (i.e., bit line BL side) is at 0[volts]. Therefore, the charge in the channel capacitance Cch1 will be leaked and discharged to the bit line BL side.

Since the channel capacitance Cch1 is larger than that shown in FIG. 2, the stored charge is more than that shown in FIG. 2, and the discharge current is larger than that shown in FIG. 2. As a result, when carriers pass through the memory cell MC12, a lot of hot electrons are generated to cause write disturbance that the hot electrons are injected into the floating gate of the neighboring memory cell MC11, the control gate of which is applied with Vm.

As described above, the nearer to the bit line contact a selected word line (i.e., a selected cell) position, the larger the cell channel capacitance Cch1 to be boosted on the source line CELSRC side of the memory cell MC12, the gate of which is applied with channel isolating-use voltage of 0[volts], thereby resulting in that the hot carrier injection efficiency for causing erroneous write becomes high at the memory cell MC11 adjacent to the memory cell MC12.

The higher the write medium voltage Vm becomes, the more easily generated the above-described write disturbance (erroneous write) phenomenon is. Therefore, there is a fear of narrowing Vm adapted range in the write pulse application operation shown in FIG. 1.

In the embodiments explained below, there will be provided write pulse application operations with such a self boost scheme that is possible to suppress erroneous write at a non-selected cell due to the above-described hot electron injection. Specifically, the embodiments are effective for devices with a minimum device feature size of 70 nm or less.

Embodiment 1

Figure 4:
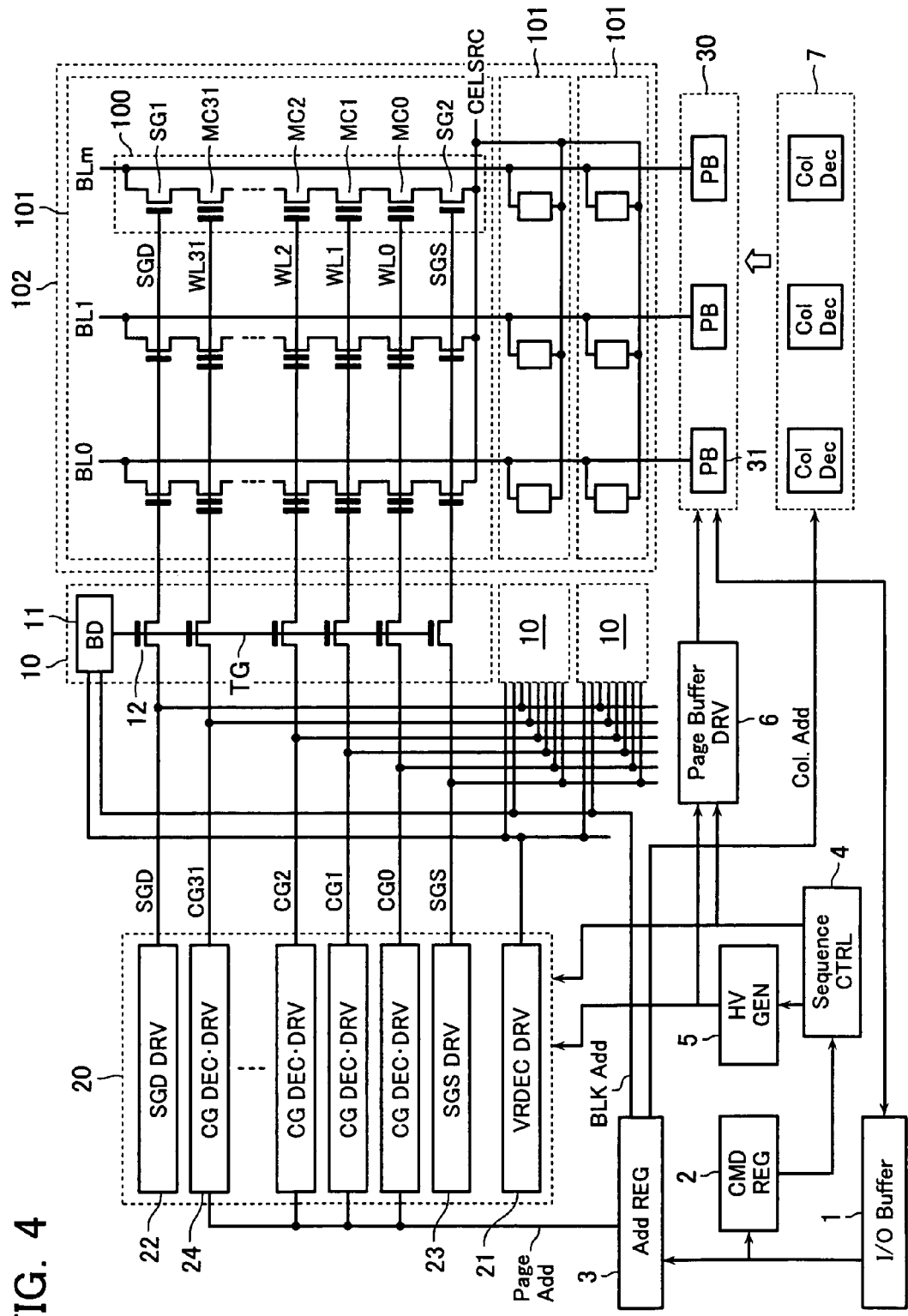
FIG. 4 shows a NAND-type flash memory in accordance with an embodiment.

FIG. 4 shows the entire and schematic composition of the NAND-type flash memory in accordance with this embodiment. NAND cell unit (i.e., NAND string) 100, which is a basic unit of the NAND-type flash memory, has a plurality of electrically rewritable and non-volatile memory cells MC0-MC31 connected in series, and two select gate transistors SG1 and SG2 disposed at both end thereof. One end of the NAND cell unit 100 is coupled to bit line BL via the select gate transistor SG1; and the other end to source line CELSRC via the select gate transistor SG2.

One memory cell has, as well known, N-type source/drain diffusion areas formed on the P-type well of a silicon substrate, and a stacked gate structure with a floating gate serving as a charge storing layer and a control gate. Changing the quantity of charge in the floating gate based on write/erase operations and changing the threshold voltage of the memory cell, the memory cell stores data of one bit or multiple bits.

The control gates of the memory cells in the NAND cell unit 100 are coupled to different word lines WL0-WL31; and gates of the select gate transistors SG1 and SG2 to select gate lines SGD and SGS.

A set of NAND cell units sharing the word lines WL0-WL31 and select gate lines SGD and SGS constitutes a block 101 serving a unit of data erasing in a lump. Usually, as shown in the drawing, multiple blocks 101 are arranged in the direction of the bit line.

The NAND-type flash memory operates in various kinds of modes in response to command input. For example, in a write mode, data load command is latched in command register 2 via a input/output circuit 1; write destination address is latched in address register 3 via the input/output circuit 1; and then write data is loaded in sense amplifier circuit (serving as write circuit) 30 via the input/output circuit 1. Then, latching write start command in command register 2 via the input/output circuit 1, the write operation will be started automatically in the chip.

That is, when the write start command is input, sequence control circuit 4 starts to control the write operation. In the write operation, some kinds of controls are performed such as voltage control necessary for data writing, timing control for write pulse application and verify-read operation, and write cycle control for repeating the write pulse application and verify-read operation until when a desired write completion is detected.

A high voltage generating circuit 5 is controlled by the sequence control circuit 4 to generate write voltage Vpgm, write middle voltage Vm and other high voltages (i.e., boosted voltage) necessary for row-system signal driver circuit 20 and page buffer control driver circuit 6.

The row-system signal driver circuit 20 has: CG decoder/drivers 24 for controlling word line voltages, the number of which is equal to that of the word lines in the NAND cell unit; SGD driver 22 for controlling the drain side select gate line SGD; SGS driver 23 for controlling the source side select gate line SGS; and VRDEC driver 21 for outputting block decoder-use boosted power supply voltage VRDEC. These drivers 21-24 are shared by multiple blocks.

Since it is in need of making a selected NAND cell unit operable with multiple voltages applied to the word lines, page addresses for selecting word lines in the NAND cell unit in a row address are input to the respective CG decoder/drivers 24.

Disposed at one end of the word lines in each block 101 in the memory cell array 102 is row decoder 10 in the narrow sense with a block selection function. The row decoder has block decoder 11 for receiving block address from the address register 3 to decode it; and transferring transistor array 12, which is controlled by the output of the block decoder 11 to transfer voltages to the word lines and select gate lines necessary for write or read. The block decoder 11 has a level shift circuit for controlling the voltage level applied to the common gate TG of the transistor array 12.

One ends of transferring transistors in the transistor array 12 are coupled to the output nodes of the drivers 21-24; and the other ends to word lines and select gate lines in the cell array. For example, in the write pulse application operation, it is in need of applying write voltage Vpgm to a selected word line. In this case, Vpgm+Vt (Vt: threshold voltage of the transferring transistors) supplied from VRDEC driver 21 is applied to the common gate TG of the transistor array 12.

The NAND-type flash memory uses FN tunneling current for data writing and erasing. Especially in the write operation, as different from a NOR-type flash memory, it is able to write a lot of memory cells at a time because the current necessary for shifting the threshold voltage of one memory cell is weak. Therefore, the read or write page length serving as a processing unit may be made large such as 2 kByte or 4 kByte. In the sense amplifier circuit 30 serving as a page buffer, there are prepared the same sense units 31 as the page length.

Column decoder 7 decodes the column address transferred from the address register 3, for example when loading write data, and couples selected sense units 31 to the input/output circuit 1, thereby setting the write data in the sense amplifier circuit 30 in accordance with each column address. In the read operation, one page data read in the page buffer 30 at a time are selected in accordance with the column address and sequentially output to the input/output circuit from the sense unit 31 with the reversed data flow in comparison with the write operation.

Omitted in FIG. 4, a certain circuit will be disposed in practice between the sense amplifier circuit 30 and the input/output circuit 1 for performing data input/output within a certain cycles.

FIG. 5 shows a relationship between the cell threshold voltages and data in a case where a four-level data storage scheme is adapted. In this example, two bits stored in a memory cell are assigned to different row addresses. That is, the lower bit is a read data when a lower page is selected; and the upper (or higher) bit is read data when an upper (or higher) page is selected.

An erase state with a negative threshold voltage is defined as data "11"; and write states with positive threshold voltage states as data "10", "00" and "01" in order of threshold voltage.

Figure 6:
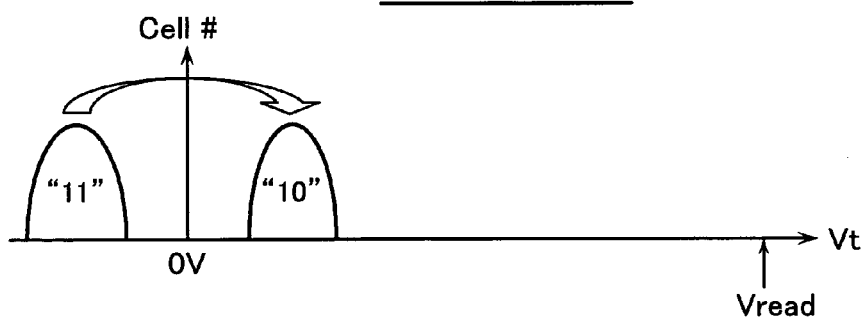
FIG. 6 shows the lower page write method of the NAND-type flash memory.

An example of write method with the above-described data assignment will be explained with reference to FIGS. 6 and 7. FIG. 6 shows a lower page write method. Selectively writing "0" into memory cells in a state of the erase state of data "11", data threshold distribution of data "10" is obtained. In this case, "1" write cells are kept at data "11", the threshold voltage of which is not shifted.

Figure 7:
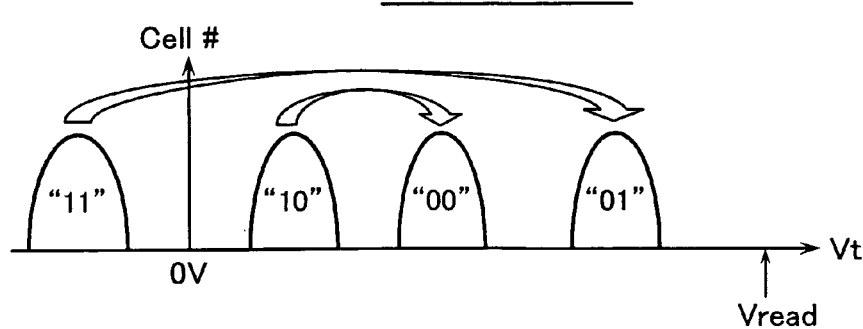
FIG. 7 shows the upper page write method of the NAND-type flash memory.

FIG. 7 shows an upper page write method. In case the upper page write is "0" write for a cell with data "11", the cell threshold voltage is shifted from the data "11" state to the data "01" state. In case the upper page write is "0" write for a cell with data "10", the cell threshold voltage is shifted from the data "10" state to the data "00" state. In case of "1" write data, data "11" and "10" threshold distributions each is kept as it is.

In this four-level data storage scheme, it is required of preceding the lower page write to the upper page write.

In the four-level data storage scheme, as shown in FIG. 7, it is in need of making three write threshold states, so that it is necessary to write threshold states higher than that in the binary data storage scheme. Therefore, it is required of sufficiently suppressing the erroneous write in the "1" write state that the cell threshold voltage is to be kept as it is.

In this embodiment, it is used such a self boost write scheme that is able to prevent the end of previously written and non-selected cells disposed on the source line side of a selected cell from being erroneously written in case the number of the previously written and non-selected cells is large as explained with reference to FIGS. 1 to 3.

Figure 8:
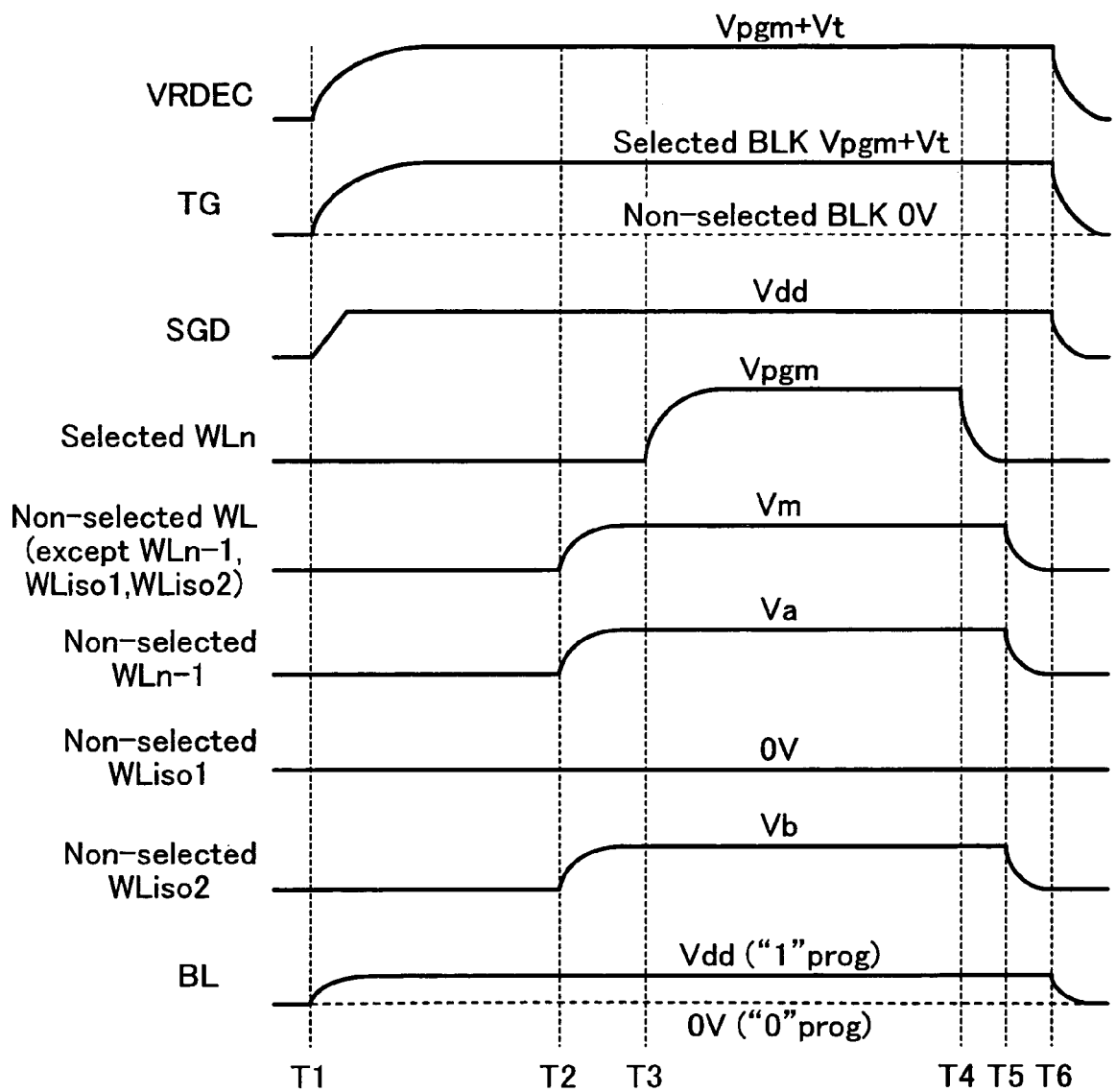
FIG. 8 shows voltage waveforms in an improved self boost write scheme of the NAND-type flash memory.
Figure 9:
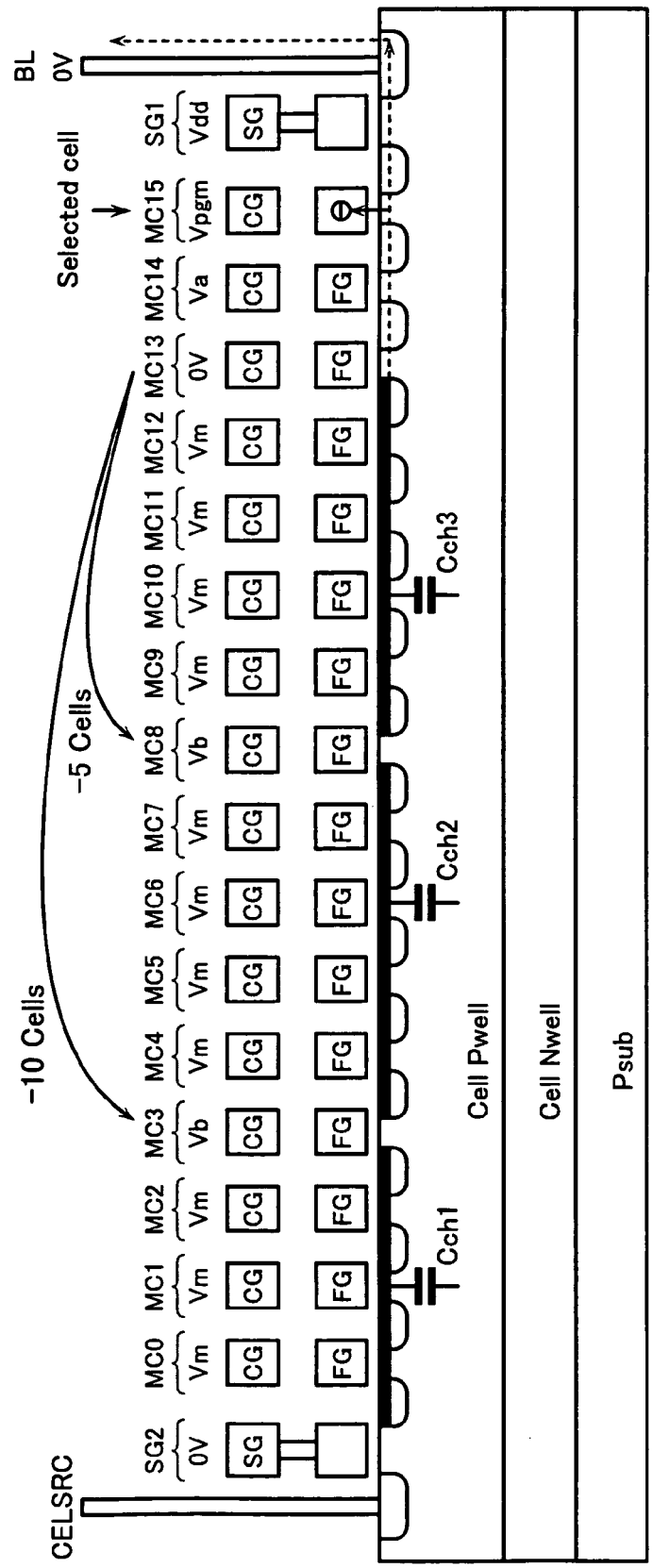
FIG. 9 shows a voltage application state in the NAND-type flash memory in such a case that the selected cell MC15 is a "0" write cell.

FIGS. 8 and 9 show the write pulse waveforms in this embodiment in correspondence with FIGS. 1 and 3, respectively. The number of cells in a NAND cell unit is sixteen or thirty two. To simplify the explanation, here is shown a case where the number of cells is sixteen like that shown in FIGS. 2 and 3. Suppose here that memory cells MC0-MC15 in the NAND cell unit are sequentially written from one disposed near the source line CELSRC.

FIG. 9 shows a case that "0" write is performed for memory cell MC15 nearest to the bit line BL. Therefore, word line WL15 (corresponding to word line WLn in FIG. 8) coupled to the memory cell MC15 is applied with write voltage Vpgm at a certain timing T3.

In this case, word line WL14 (corresponding to word line WLn-1 in FIG. 8) coupled to the neighboring memory cell MC14 is applied with voltage Va (about 3 volts) at timing T2 previously to the write voltage Vpgm application. Word line WL13 (corresponding to word line WLisol in FIG. 8) coupled to memory cell MC13 neighboring to memory cell MC14 is applied with Vc(=0 volts) that is used for channel-separating or channel-isolating the unwritten cells' channel region from the previously written cells' channel region.

In the conventional case shown in FIGS. 2 and 3, all the remaining non-selected word lines has been applied in with the write medium voltage Vm rising at timing T2. By contrast, in this embodiment, another channel-isolating voltage Vb is applied to few or some non-selected memory cells in the non-selected cell group (previously written and non-selected cells) disposed on the source line CELSRC side of the selected cell.

In detail, in the example shown in FIG. 9, word lines WL8 and WL3 (corresponding to word line WLiso2 shown in FIG. 8), which are coupled to memory cells MC8 and MC3 disposed at intervals of five cells as counted from the channel isolating memory cell MC13 toward the source line CELSRC side, are applied with the channel-isolating voltage Vb.

Voltage Vb is selected in a range of about 0[volts] to 3[volts]. The upper limit of the voltage Vb will be selected to satisfy such a condition that the transferable source or drain voltage of a memory cell with Vb applied to the gate is suppressed as being about 3[volts]. This is for avoiding the possibility of generating unnecessary hot carriers based on the voltage transferring between source and drain in the memory cell with the voltage Vb applied.

Suppose, for example, that the memory cell with Vb applied is in the erase state with −1[volts] threshold voltage. Vb being applied to the gate, the memory cell is kept on while the source voltage is under Vb+1[volts]. That is, transferable voltage of this memory cell is Vb+1[volts]. To suppress Vb+1 [volts] as being 3[volts] or less, Vb is equal to 2[volts] or less.

On the other hand, if Vb is too low, it is a fear that band-to-band tunneling is generated at the source/drain edge of the memory cell with Vb applied because the neighboring non-selected cell is applied with Vm. Considering this point, it will be desired that Vb is high. In consideration of the above-described situation, an optimum voltage Vb will be used in the range of Vb≧Vc.

In FIG. 9, the channel-isolating voltage Vb is applied to non-selected memory cells MC8 and MC3, which are disposed at intervals of certain cell numbers on the source line side of the memory cell MC13 with the channel-isolating voltage Vc=0[volts] applied. As a result, previously written and non-selected cells are classified into three memory cell groups (i.e., three channel sections) with Vm applied, which are defined by the boundary cells with Vb applied.

With the above-described voltage application, when the write medium voltage Vm is applied at timing T2 as shown in FIG. 8, it becomes easy to electrically isolate the channel regions (each including diffusion areas) of the three memory cell groups from each other. In other words, it is dealt with that the channel capacities Cch1, Cch2 and Cch3 of the three memory cell groups become substantially independent of each other.

Therefore, even if there are many previously written and non-selected cells, the discharge current due to channel charge thereof is suppressed to be smaller than that in the conventional case explained with reference to FIG. 3. In detail, the discharge current flowing through the channel of memory cell MC13 with 0[volts] applied is based on charge of the channel capacitance Cch3 defined by the channel region and the diffusion area in the range of memory cells MC9-MC12, so that it will be about ⅓ in comparison with that in the conventional case explained with reference to FIG. 3. As a result, the erroneous write of memory cell MC12 is suppressed.

Next, some cases will be verified with detailed numerical examples below.

(Case 1)

Suppose that the channel-isolating voltage Vb is set at 0[volts], and threshold voltages of the memory cells MC3, MC8 and MC13, which are applied with Vb=Vc=0[volts], are 2[volts], 2[volts] and 0.5[volts], respectively. In this case, the memory cells MC3, MC8 and MC13 are theoretically cut-off.

Memory cell MC13 has a positive and small threshold voltage. If the whole channel region of the previously written cells is boosted by the write medium voltage Vm, discharge current flows through this memory cell MC13 toward the bit line.

However, the memory cell MC8 is cut off within the previously written cells. Therefore, the channel capacitance of the previously written cells, which serves as a current source of the previously written cells and causes hot carrier injection of the memory cell MC12, is not defined by all of the previously written cells but limited to that, Cch3, defined by the memory cells MC9-MC12. As a result, the write disturbance of the memory cell MC12 will be suppressed.

(Case 2)

Suppose that the channel-isolating voltage Vb is set at 0[volts], and threshold voltages of the memory cells MC3, MC8 and MC13, which are applied with Vb=Vc=0[volts], are 2[volts], 0.5[volts] and −1[volts], respectively. In this case, the memory cells MC3 and MC8 are theoretically cut-off while the memory cell MC13 is on.

Memory cell MC8 has a positive and small threshold voltage. If the discharge current flowing through this memory cell MC8 is large at the channel boosting time, there is a possibility of generating hot carrier injection for the memory cell MC7.

However, the channel capacitance to be boosted by the write medium voltage Vm on the source line side of the memory cell MC8, that serves as the discharge current source, is limited to that, Cch2, defined under the memory cells MC4-MC7 because the memory cell MC3 is off. Therefore, the write disturbance of the memory cell MC7 is suppressed.

(Case 3)

Suppose that the channel-isolating voltage Vb is set at 0[volts], and threshold voltages of the memory cells MC3, MC8 and MC13, which are applied with 0[volts], are −2[volts], −2[volts] and 0.5[volts], respectively. In this case, the memory cells MC3 is cut-off, and the channel capacitances Cch1, Cch2 and Cch3 defined by the previously written and non-selected cells are boosted to certain potentials, respectively, when Vm is applied.

Since the memory cell MC13 has a small and positive threshold voltage, a leakage current flows through this cell. Therefore, charge of the channel capacitances Cch1, Cch2 and Cch3 is finally discharged through this memory cell MC13.

However, supposing that the threshold voltage of the memory cell MC3 and MC8 is Vt, the transferable voltage of these memory cells is about Vb−Vt=0−(−2)=2[volts]. It will be decided by the capacitance Cch3 whether the leakage current of the memory cell MC13 generates hot electrons or not. If the channels and diffusion areas of the capacitances Cch1, Cch2 and Cch3 are at about 2[volts], respectively, these are electrically coupled to each other, thereby becoming the same potential. However, since the source-drain voltage of the memory cell MC13 is small, it is not generated such hot electrons that are injected into the floating gate of the memory cell MC12.

In other words, the channel capacitance Cch3 being limited to such a level that hot electron injection for the memory cell MC1 is negligible, the write disturbance due to the hot electron injection is suppressed.

(Case 4)

Suppose that Vb=0[volts], and all of the threshold voltages of memory cells MC3, MC8 and MC13 is Vt=−2[volts]. In this case, the memory cells MC3, MC8 and MC13 are not cut off, so that the channel regions and diffusion regions of the previously written and non-selected cells, the gates of which are applied with the write voltage Vm, are not boosted to be kept at the same voltage, 0[volts], as those of the unwritten cells on the bit line side. Therefore, the write disturb will not occur.

As described above, according to this embodiment, it is solved such a problem of the self boost scheme that as the selected cell becomes near to the bit line contact, erroneous write due to hot electron injection becomes easily generated. While, in the example, non-selected memory cells selected at intervals of five cells from the non-selected cell with the channel isolating voltage of Vc=0[volts] applied are applied with another channel isolating voltage Vb, the interval of cells to be applied with Vb will be suitably selected in accordance with the cell size, the capacity of the NAND cell unit and the like so that the interval of two cells is kept at a minimum.

Figure 10:
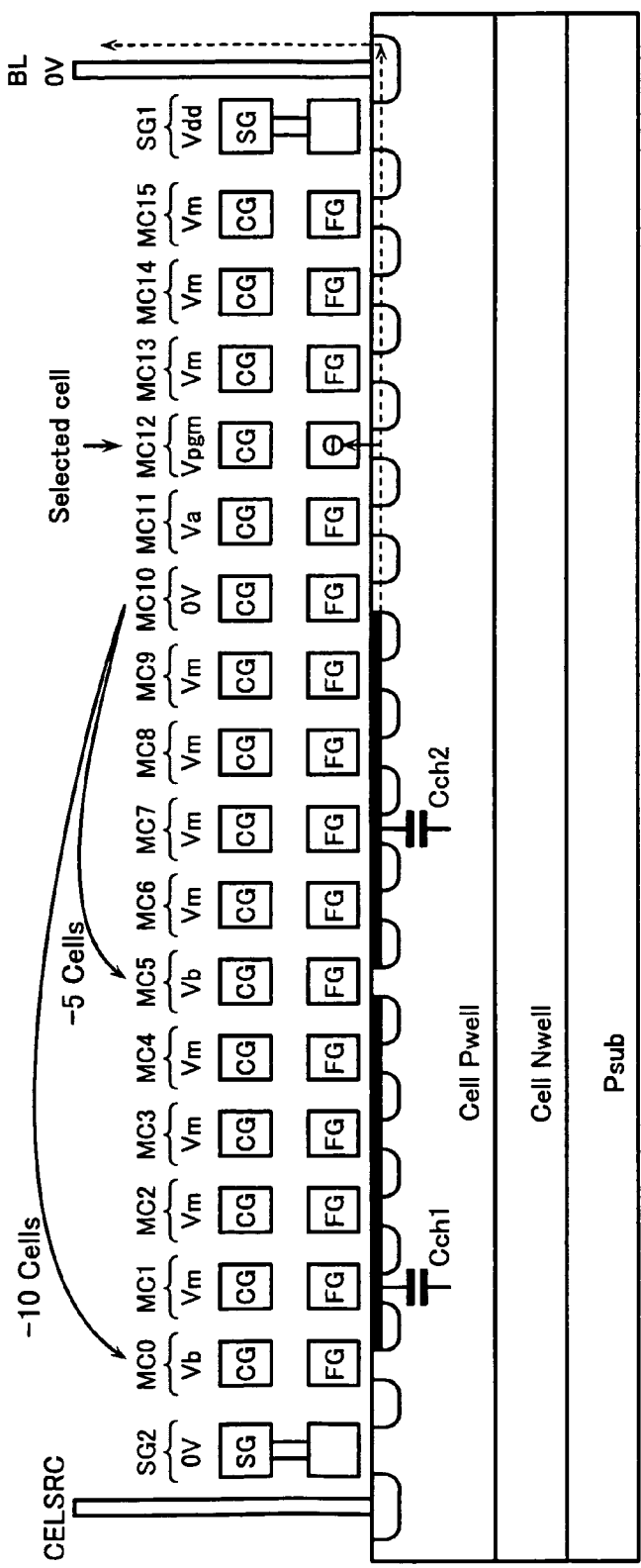
FIG. 10 shows a voltage application state in the NAND-type flash memory in such a case that the selected cell MC12 is a "0" write cell.

FIG. 10 shows another write pulse application state, to which the same rule as FIG. 9 is adapted, in case MC12 is a selected cell to be written into a "0" state. In this embodiment, the channel isolating voltage Vb is applied to every fifth non-selected memory cell counted from the non-selected memory cell with 0[volts] applied. Therefore, in FIG. 10, memory cells MC0 and MC5 are applied with channel isolating voltage Vb.

In this case, the previously written and non-selected cells, to which Vm is applied, are classified into two cell groups, and the channel regions and diffusion areas are divided into capacitances Cch1 and Cch2 defined under memory cells MC1-MC4 and MC6-MC9, respectively, to be boosted independent of each other.

Figure 11:
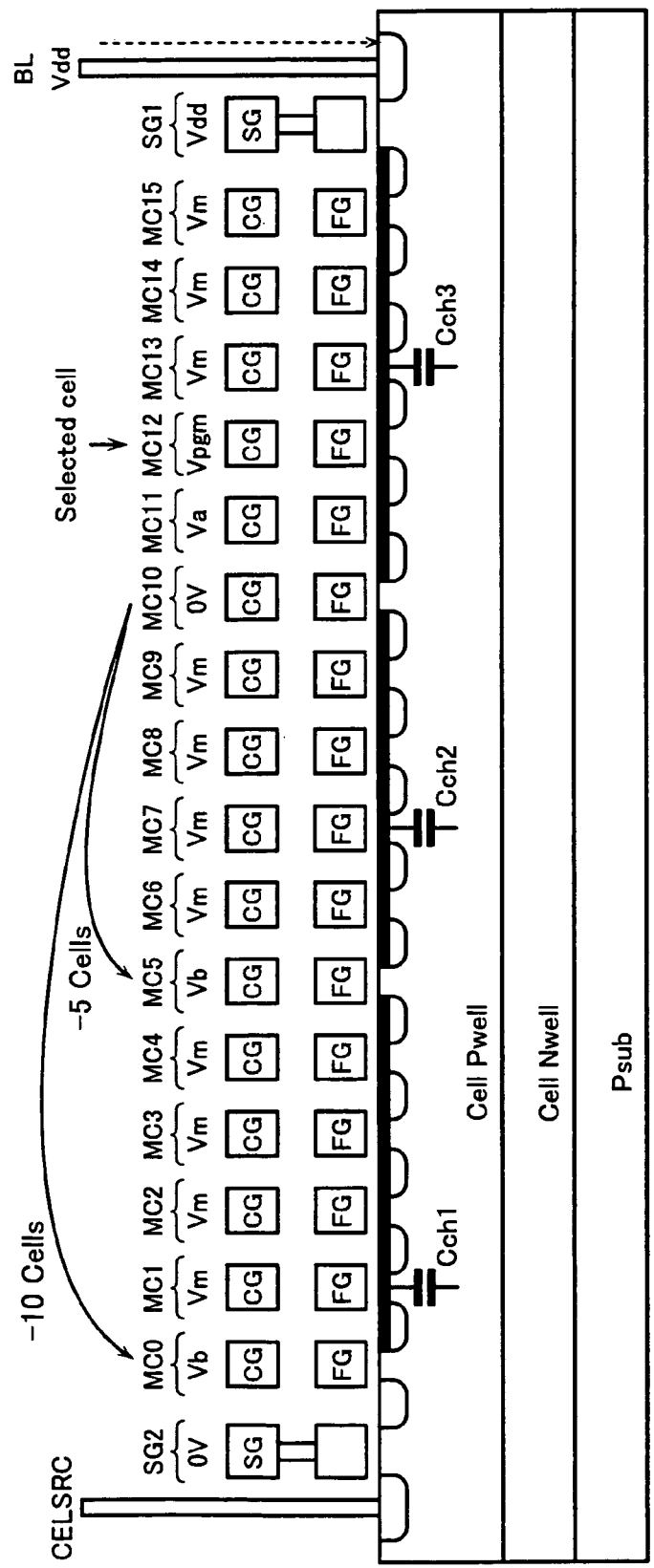
FIG. 11 shows a voltage application state in the NAND-type flash memory in such a case that the selected cell MC12 is a "1" write cell.

FIG. 11 shows the write pulse application state in case MC12 is a selected cell like that shown in FIG. 10, but it is to be written into a "1" state. In this case, the channels and diffusion areas in the NAND cell unit are charged-up to a level, with which the bit line side select gate transistor SG1 is cut off, to be floating at Vdd−Vt based on the "1" write data voltage Vdd applied to the bit line BL.

Therefore, the write medium voltage Vm being applied to the non-selected word lines at timing T2, the channels and diffusion areas are boosted by capacitive coupling from the word lines.

In case of "1" write in this embodying write method, it is in need of sufficiently boosting the channels and diffusion areas including the selected cell's ones, i.e., capacitance Cch3, to such a level that is enough to bear the write disturbance of the selected cell itself. For this purpose, it is required of the channels and diffusion areas of memory cells MC6-MC9, i.e., capacitance Cch2, to be boosted to a certain level.

In other words, to prevent the voltage of channels and diffusion areas of memory cells MC11-MC15 including the selected cell from being leaked to those of memory cells MC6-MC9, the channels and diffusion areas of memory cells MC6-MC9 are required to be boosted to such a level that the memory cell MC12 with the channel isolating-voltage Vb (e.g., 0[volts]) applied is certainly cut off even if its threshold voltage is negative (e.g., −2[volts]).

According to this embodiment, the channel-isolating voltage Vb (e.g., 0[volts]) is applied to cells at intervals of a certain cell numbers on the source line side from the cell with the channel-isolating voltage Vc(=0[volts]) applied. Therefore, the characteristic of the selected cell is not extremely varied in spite of the selected cell's position, and write disturbance will be prevented.

Embodiment 2

In the above-described Embodiment 1, the positions of cells, to which the channel-isolating voltage Vb is applied, are relatively determined on the basis of the cell with the channel isolating-voltage Vc(=0[volts]) applied. By contrast, in the Embodiment 2 shown in FIGS. 12 and 13, the NAND cell unit is classified into some groups with the same cell numbers, and the channel-isolating voltage Vb is applied to at least one lo memory cell (i.e., word line) in each group, the position of which is fixed in the group.

However, with respect to a group neighboring on the cell source line side of that including the selected cell, the voltage Vb is not applied because there is a cell with the channel-isolating voltage Vc=0[volts] applied within or at least near the group in accordance with the selected cell position.

Figure 12:
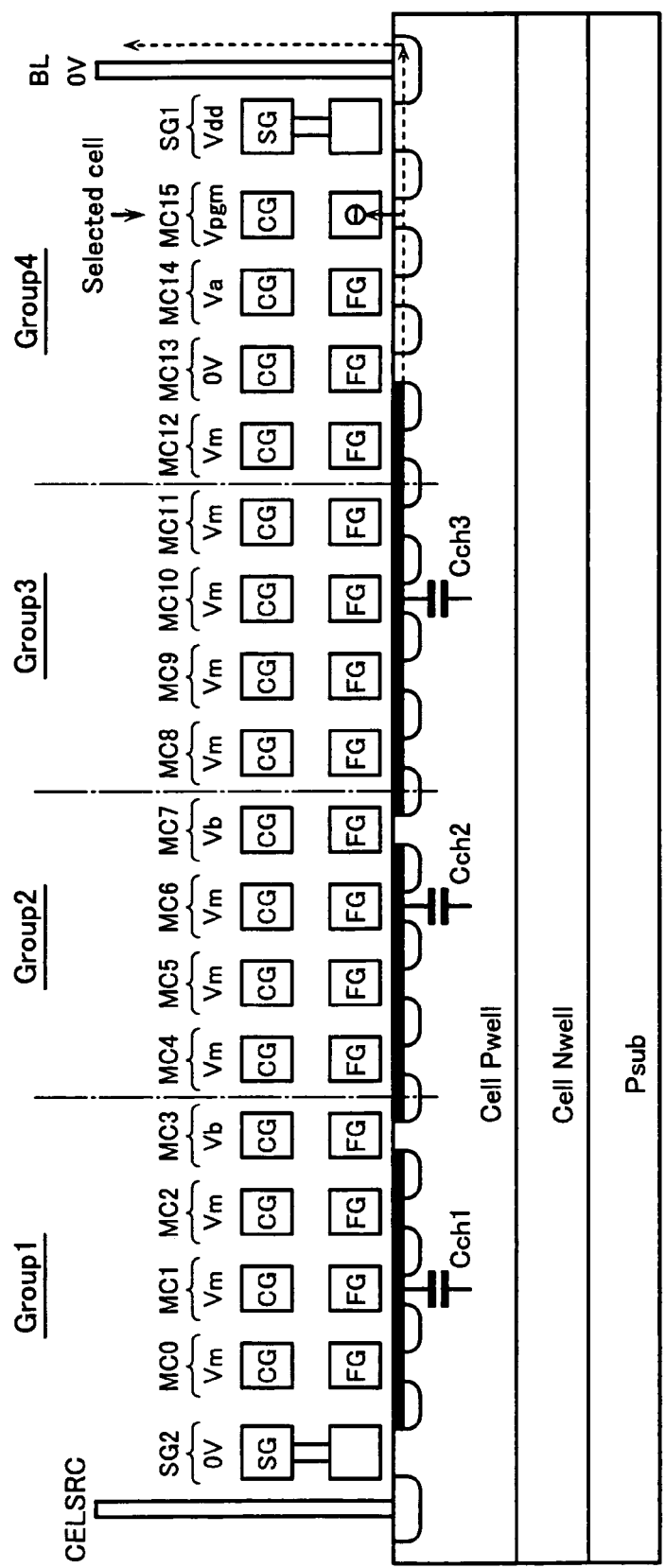
FIG. 12 shows a voltage application state in the NAND-type flash memory in such a case that the selected cell MC15 is a "0" write cell in an improved self boost scheme in accordance with another embodiment.
Figure 13:
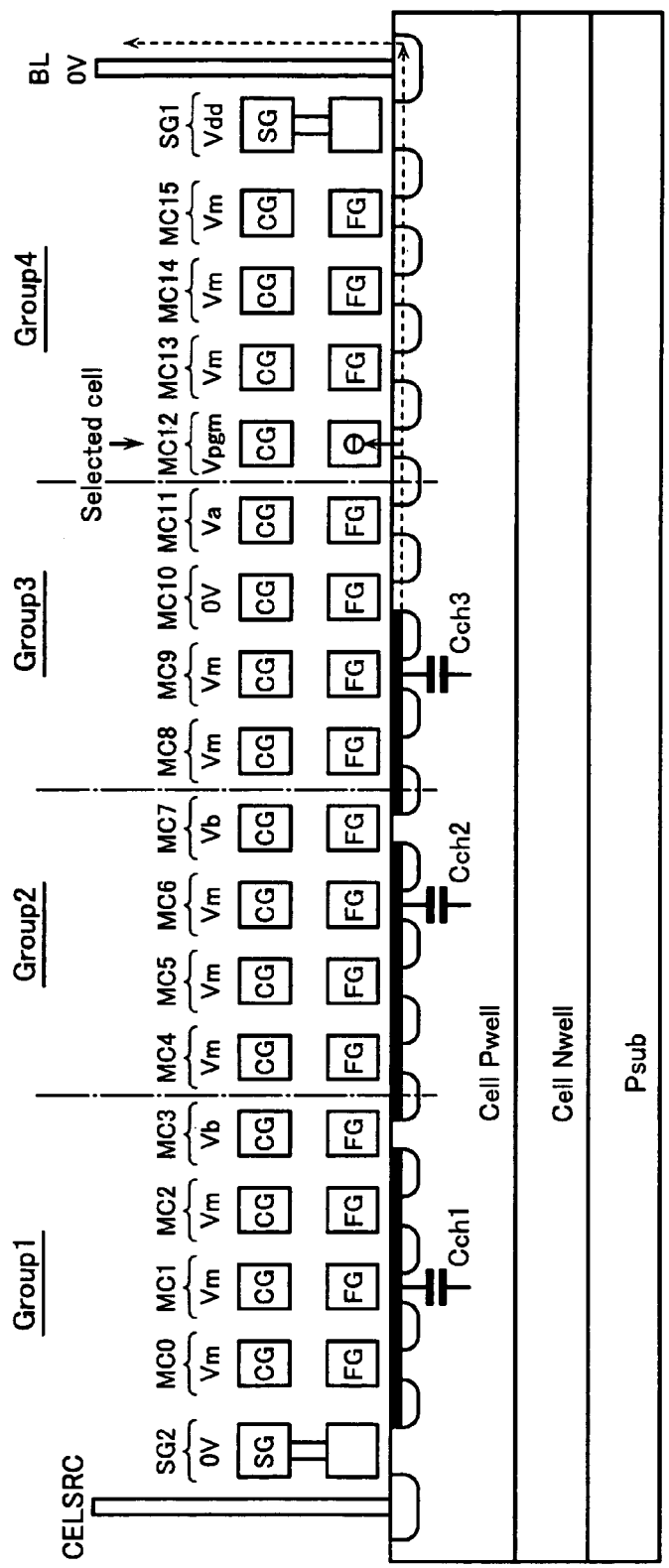
FIG. 13 shows a voltage application state in the NAND-type flash memory in such a case that the selected cell MC12 is a "0" write cell in accordance with the embodiment.

In the example shown in FIGS. 12 and 13, the number of cells in the NAND cell unit is sixteen, and the cells are divided into four groups, Group1-4. FIGS. 12 and 13 show such a case that a selected cell is in Group4. In this case, memory cells MC3 and MC7 nearest to the bit line in the groups, Group1 and Group2, are applied with Vb, respectively. Group3 being adjacent to Group4 including the selected cell, there is not applied with Vb.

A merit of this method is in that there is no need of preparing Vb generating circuit in the entire word line drivers because the word lines with the channel-isolating voltage Vb applied are fixed in position. Therefore, according to this embodiment, the word line drive circuit is simplified and the same effect as the Embodiment 1 will be obtained.

Embodiment 3

As an embodiment, an electric card using the non-volatile semiconductor memory devices according to the above-described embodiments of the present invention and an electric device using the card will be described bellow.

Figure 14:
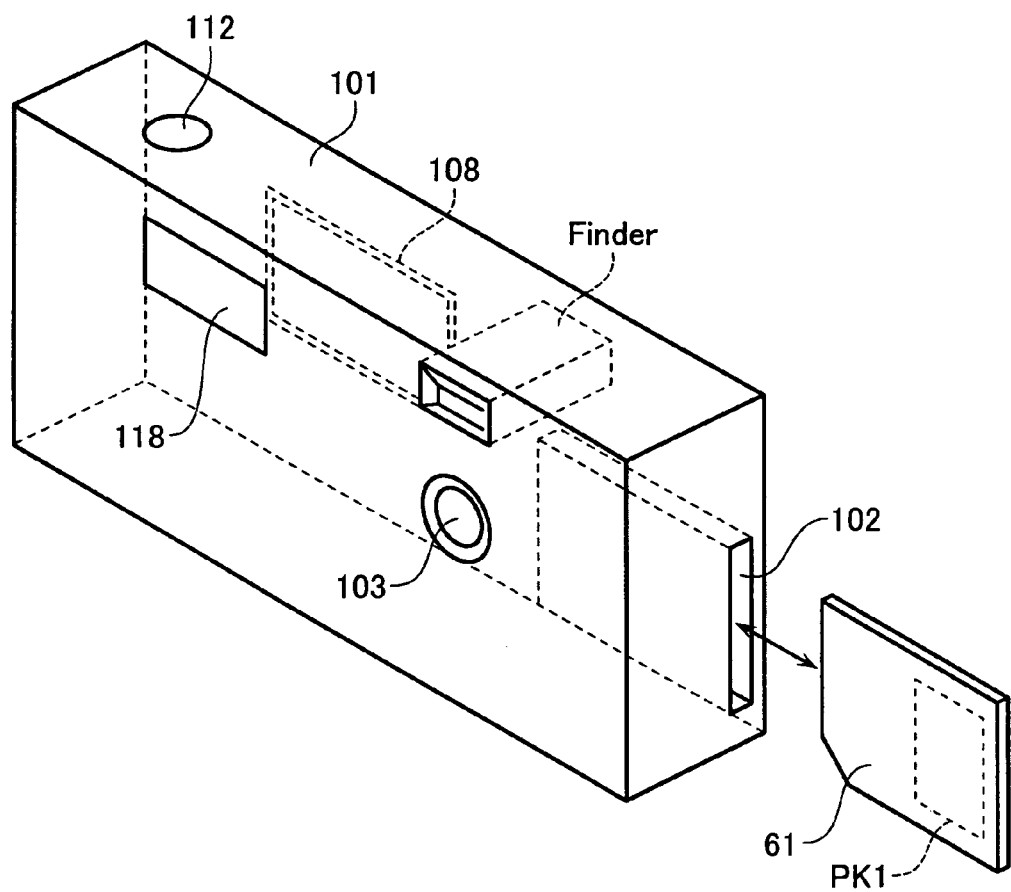
FIG. 14 shows another embodiment applied to a digital still camera.

FIG. 14 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 15:
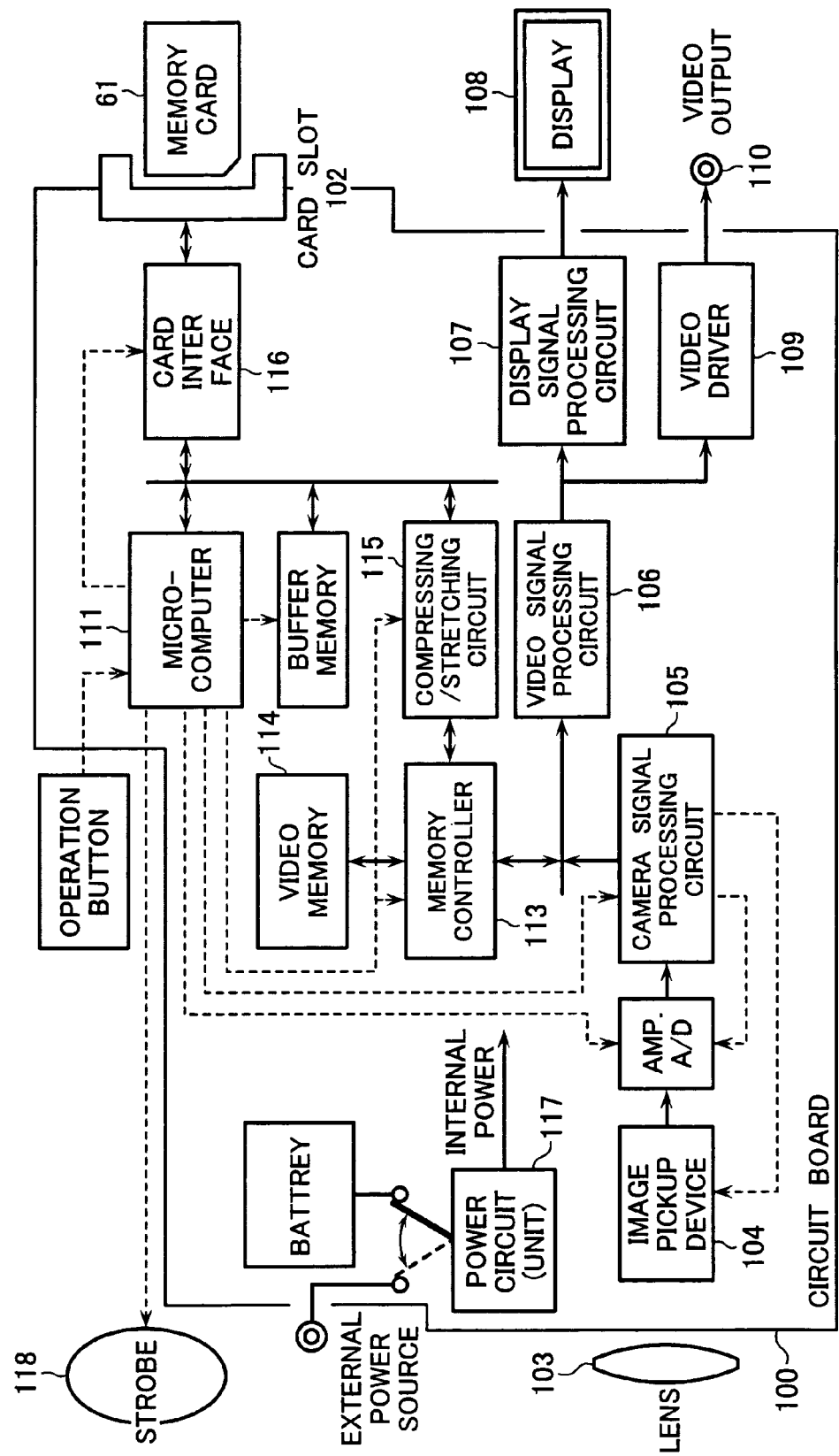
FIG. 15 shows the internal configuration of the digital still camera.

FIG. 15 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

Figure 16A:
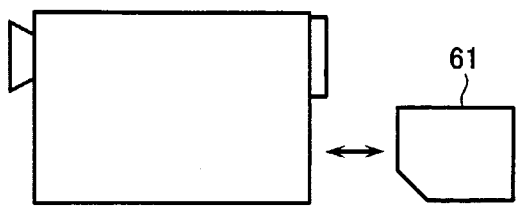
FIGS. 16A to 16J show other electric devices to which the embodiment is applied.
Figure 16B:
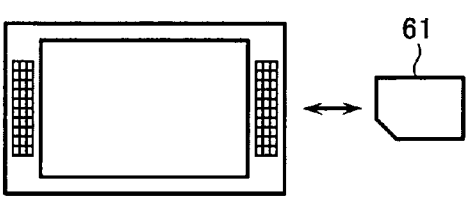
Figure 16C:
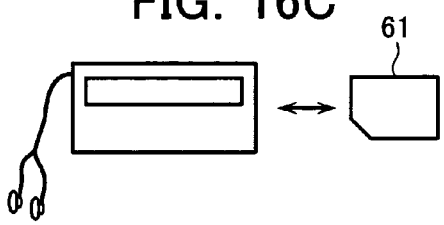
Figure 16D:
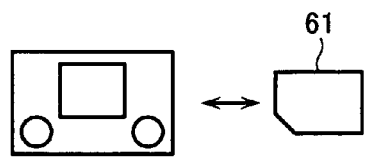
Figure 16E:
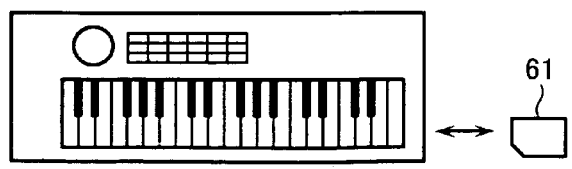
Figure 16F:
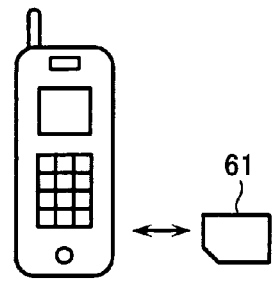
Figure 16G:
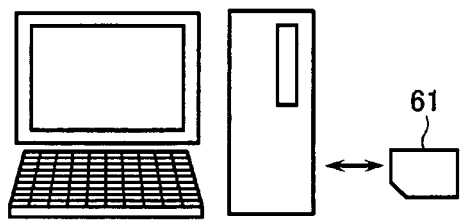
Figure 16H:
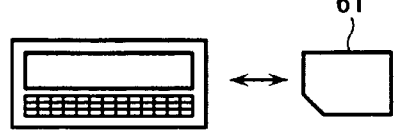
Figure 16I:
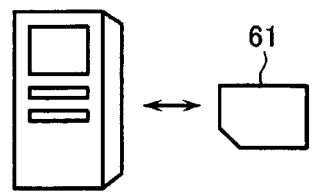
Figure 16J:
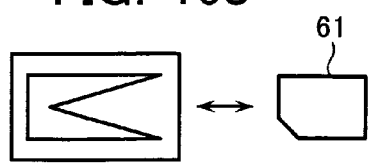

As described above, the electric card according to this embodiment can be used in portable electric devices such as the digital still camera explained above. However, the electric card can also be used in various apparatus such as shown in FIGS. 16A to 15J, as well as in portable electric devices. That is, the electric card can also be used in a video camera shown in FIG. 16A, a television set shown in FIG. 16B, an audio apparatus shown in FIG. 16C, a game apparatus shown in FIG. 16D, an electric musical instrument shown in FIG. 16E, a cell phone shown in FIG. 16F, a personal computer shown in FIG. 16G, a personal digital assistant (PDA) shown in FIG. 16H, a voice recorder shown in FIG. 16I, and a PC card shown in FIG. 16J.

This invention is not limited to the above-described embodiment. It will be understood by those skilled in the art that various changes in form and detail may be made without departing from the spirit, scope, and teaching of the invention.

What is claimed is:

1. A non-volatile semiconductor memory device comprising: a NAND cell unit with a plurality of memory cells that are electrically rewritable and non-volatile, and that are connected in series; a source line coupled to a first end of the NAND cell unit; and a bit line coupled to a second end of the NAND cell unit, wherein the NAND cell unit is biased in a data write mode as follows:

a write voltage Vpgm is applied to a control gate of a selected memory cell in the NAND cell unit;

a channel-isolating voltage is applied to control gates of a plurality of non-selected memory cells disposed on the source line side of the selected memory cell at a plurality of intervals of memory cells; and a write medium voltage Vm lower than Vpgm is applied to control gates of the non-selected memory cells that are between said non-selected memory cells to which the channel-isolating voltage is applied.

2. The non-volatile semiconductor memory device according to claim 1, wherein in the data write mode, the control gates of the non-selected memory cells on the source line side of the selected memory cell are biased as follows:

a first channel-isolating voltage Vc is applied to the second non-selected memory cell from the selected memory cell;

a voltage Va slightly higher than Vc is applied to a non-selected memory cell adjacent to the selected memory cell;

a second channel-isolating voltage Vb($\geq$Vc) is applied to non-selected memory cells disposed between said plurality of intervals of memory cells on the source line side of the non-selected memory cell that has the first channel-isolating voltage Vc applied thereto; and the write medium voltage Vm is applied to the non-selected memory cells that are between said non-selected memory cells to which the channel-isolating voltage is applied.

3. The non-volatile semiconductor memory device according to claim 2, wherein a plurality of channel regions of the non-selected memory cells on the source line side of the selected memory cell are isolated from each other channel region of said plurality of channel regions by the non-selected memory cells with second channel-isolating voltage Vb applied thereto as boundaries, and each channel region is boosted independently of each other channel region of said plurality of channel regions with the write medium voltage Vm.

4. The non-volatile semiconductor memory device according to claim 2, wherein the NAND cell unit is classified into a plurality of groups, each group including a same number of memory cells, and in the data write mode, the second channel-isolating voltage Vb is applied to a non-selected memory cell at a fixed location in each group disposed on the source line side of the selected memory cell.

5. The non-volatile semiconductor memory device according to claim 4, wherein the first channel-isolating voltage Vc and the voltage Va slightly higher than the first channel-isolating voltage Vc are applied to the second and first non-selected memory cells on the source line side of the selected memory cell in a first group including the selected memory cell, respectively; and the second channel-isolating voltage Vb is applied to non-selected memory cells, which are fixedly located in the plurality of groups except the first group and next to a neighboring group on a source line side.

6. The non-volatile semiconductor memory device according to claim 2, wherein the first channel-isolating voltage Vc is set at 0V while the second channel-isolating voltage Vb is set at a level between 0V and 3V.

7. The non-volatile semiconductor memory device according to claim 1, wherein the device is formed with a minimum device feature size of 70 nm or less.

8. A non-volatile semiconductor memory device comprising: a NAND cell unit with a plurality of electrically rewritable and non-volatile memory cells connected in series;

a source line coupled to one end of the NAND cell unit; and a bit line coupled to the other end of the NAND cell unit, wherein the NAND cell unit is biased in a data write mode as follows:

a write voltage Vpgm is applied to a control gate of a selected memory cell in the NAND cell unit;

a first channel-isolating voltage Vc is applied to a control gate of a non-selected memory cell located near the selected memory cell on the source line side for isolating a first channel region of unwritten memory cells on the bit line side from a second channel region of previously written memory cells on the source line side;

a second channel-isolating voltage Vb ($\geq$Vc) is applied to control gates of non-selected memory cells disposed at intervals of a certain number of memory cells on the source line side of the non-selected memory cell with the first channel-isolating voltage Vc applied for dividing the second channel region into multiple channel sections; and a write medium voltage Vm (Vb<Vm<Vpgm) is applied to control gates of the remaining non-selected memory cells.

9. The non-volatile semiconductor memory device according to claim 8, wherein the first channel-isolating voltage Vc is applied to the second non-selected memory cell from the selected memory cell; a voltage Va slightly higher than Vc is applied to a non-selected memory cell adjacent to the selected memory cell; the second channel-isolating voltage Vb is applied to non-selected memory cells disposed at intervals of a certain number of cells on the source line side of the non-selected memory cell with the first channel-isolating voltage Vc applied; and the write medium voltage Vm is applied to the remaining non-selected memory cells.

10. The non-volatile semiconductor memory device according to claim 8, wherein the multiple channel sections are isolated from each other dealing with the non-selected memory cells with second channel-isolating voltage Vb applied as boundaries, and boosted independently of each other with the write medium voltage Vm.

11. The non-volatile semiconductor memory device according to claim 8, wherein the NAND cell unit is classified into multiple groups including the same number of memory cells as each other, and in the data write mode, the second channel-isolating voltage Vb is applied to a non-selected memory cell at a fixed location in each group disposed on the source line side of the selected memory cell.

12. The non-volatile semiconductor memory device according to claim 11, wherein the first channel-isolating voltage Vc and the voltage Va are applied to the second and first non-selected memory cells respectively on the source line side of the selected memory cell in a first group including the selected memory cell; and the second channel-isolating voltage Vb is applied to non-selected memory cells, which are fixedly located in the second groups except the first group and the source line side neighbor.

13. The non-volatile semiconductor memory device according to claim 8, wherein the first channel-isolating voltage Vc is set at 0V while the second channel-isolating voltage Vb is set at a level between 0V and 3V.

14. The non-volatile semiconductor memory device according to claim 8, wherein the device is formed with a minimum device feature size of 70 nm or less.

15. A method of writing a non-volatile semiconductor memory device with a plurality of electrically rewritable and non-volatile semiconductor memory cells connected in series to constitute a NAND cell unit, both ends of the NAND cell unit being coupled to a bit line and a source line, respectively, said method comprising:
  controlling the channel potential of a selected memory cell in the NAND cell unit in accordance with write data supplied via the bit line; and
  applying a write voltage Vpgm and a write medium voltage Vm (<Vpgm) to a control gate of the selected memory cell and control gates of a plurality of non-selected memory cells, respectively,
  wherein a channel-isolation voltage is applied to control gates of a plurality of non-selected memory cells disposed on the source line side of the selected memory cell at a plurality of intervals of memory cells simultaneously with the write voltage.

16. The method according to claim 15, wherein the NAND cell unit is biased at the write voltage application time as follows:
  a first channel-isolation voltage Vc is applied to the second non-selected memory cell from the selected memory cell;
  a voltage Va slightly higher than the channel-isolating voltage Vc is applied to a non-selected memory cell adjacent to the selected memory cell;
  a second channel-isolating voltage Vb ($\geqq$Vc) is applied to non-selected memory cells disposed at said plurality of intervals of memory cells on the source line side of the non-selected memory cell with the first channel-isolating voltage Vc applied thereto; and the write medium voltage Vm is applied to the non-selected memory cells that are between said non-selected memory cells to which the channel-isolating voltage is applied.

17. The method according to claim 15, wherein
  the NAND cell unit is classified into a plurality of groups, each group including the same number of memory cells, and the channel-isolating voltage is applied at a write voltage application time to a non-selected memory cell at a fixed location in each group disposed on the source line side of the selected memory cell.

* * * * *